United States Patent
Gerlach et al.

(10) Patent No.: US 6,797,953 B2
(45) Date of Patent: Sep. 28, 2004

(54) ELECTRON BEAM SYSTEM USING MULTIPLE ELECTRON BEAMS

(75) Inventors: Robert L. Gerlach, Portland, OR (US); Paul P. Tesch, Portland, OR (US); Walter Skoczylas, Aloha, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/081,247

(22) Filed: Feb. 22, 2002

(65) Prior Publication Data

US 2002/0117967 A1 Aug. 29, 2002

Related U.S. Application Data (60) Provisional application No. 60/270,799, filed on Feb. 23, 2001.

(51) Int. Cl.[7] .......................... G01N 23/00; H01J 37/06; H01J 29/56
(52) U.S. Cl. ........................ 250/310; 250/411; 315/13.1
(58) Field of Search ............................. 315/13.1, 5.39; 250/310, 311, 306, 309, 441, 307, 397, 42.3, 441.11, 442.11, 492

(56) References Cited

U.S. PATENT DOCUMENTS

| | | | | |
|---|---|---|---|---|
| 4,020,353 A | * | 4/1977 | Saito et al. | 250/441.11 |
| 4,126,781 A | | 11/1978 | Siegel | 250/281 |
| 4,390,789 A | | 6/1983 | Smith et al. | 250/492.2 |
| 4,694,178 A | | 9/1987 | Harte | 250/396 |
| 4,818,872 A | | 4/1989 | Parker et al. | 250/309 |
| 4,945,247 A | * | 7/1990 | Kawasaki et al. | 250/423 F |
| 5,003,178 A | * | 3/1991 | Livesay | 250/492.3 |
| 5,177,402 A | | 1/1993 | Howard et al. | 315/1 |
| 5,502,306 A | * | 3/1996 | Meisburger et al. | 250/310 |
| 5,528,034 A | * | 6/1996 | Yamazaki et al. | 250/309 |
| 5,834,770 A | | 11/1998 | Holkeboer et al. | 250/281 |
| 5,945,677 A | | 8/1999 | Leung et al. | 250/396 |
| 5,981,962 A | | 11/1999 | Groves et al. | 250/492.23 |
| 6,023,060 A | | 2/2000 | Chang et al. | 250/310 |
| 6,211,518 B1 | | 4/2001 | Richardson et al. | 250/310 |
| 6,215,128 B1 | | 4/2001 | Mankos et al. | 250/492.24 |
| 6,218,060 B1 | | 4/2001 | Yasuda | 430/30 |
| 6,218,664 B1 | | 4/2001 | Krans et al. | 250/310 |
| 6,355,383 B1 | | 3/2002 | Yamashita | 430/5 |
| 6,407,399 B1 | * | 6/2002 | Livesay | 250/492.3 |
| 6,476,390 B1 | * | 11/2002 | Murakoshi et al. | 250/310 |
| 2002/0109090 A1 | * | 8/2002 | Nakasuji et al. | 250/311 |

FOREIGN PATENT DOCUMENTS

| | | | | |
|---|---|---|---|---|
| WO | WO 98/48443 | 10/1998 | | H01J/37/30 |
| WO | WO 99/34397 | 7/1999 | | H01J/37/28 |
| WO | WO 99/45565 | 9/1999 | | H01J/37/26 |
| WO | WO 99/47978 | 9/1999 | | H01J/37/317 |
| WO | WO 00/46831 | 8/2000 | | H01J/9/18 |

OTHER PUBLICATIONS

"Development of Ion Sources for Ion Projection Lithography," *J. Vac. Sci. Technol. B*, vol. 14, No. 6 (1996), pp. 3947–3950.

(List continued on next page.)

*Primary Examiner*—Don Wong
*Assistant Examiner*—Chuc Tran
(74) *Attorney, Agent, or Firm*—Michael O. Scheinberg (57) ABSTRACT

A charged particle beam system uses multiple electron columns to increase throughput. One or more multiple electron emitters are in one or more vacuum sealable gun chambers to allow the gun chamber to be replaced with electrons guns having emitters that have been previously conditioned so that the system does not need to be out of service to condition the newly installed emitters.

39 Claims, 9 Drawing Sheets

OTHER PUBLICATIONS

"Energy Spread of Ion Beams Generated in Multicusp Ion Sources," *IEEE*, (1996), pp. 2542–2544.

"A Compact Filament–Driven Multicusp Ion Source," *Nuclear Instruments and Methods in Physics Research B*, vol. 119 (1996), pp. 543–548.

"Beam Emittance Measurements on Multicusp Ion Sources," *Rev. Sci. Instrum.*, vol. 67, No. 3 (1996), pp. 1249–1251.

"Ion Energy Spread and Current Measurements of the rf–driven Multicusp Ion Source," *Rev. Sci. Instrum.* vol. 68, No. 3 (1997), pp. 1398–1402.

"Axial Energy Spread Measurements of an Accelerated Positive Ion Beam," *Nuclear Instruments and Methods in Physics Research A*, vol. 385, (1977), pp. 204–208.

"Production of Low Energy Spread Ion Beams with Multicusp Sources," *Nuclear Instruments and Methods in Physics Research A*, vol. 374 (1996), pp. 1–6.

"Multicusp Sources for Ion Beam Lithography Applications," *J. Vac. Sci. Technol. B.*, vol. 13, No. 6 (1995), pp. 2600–2602.

* cited by examiner

ELECTRON BEAM SYSTEM USING MULTIPLE ELECTRON BEAMS

This application claims priority from U.S. Provisional Patent Application 60/270,799, filed Feb. 23, 2001, which is hereby incorporated by reference.

TECHNICAL FIELD OF THE INVENTION

The present invention relates to the field of electron beam systems and in particular to electron beam systems that produce multiple electron beams.

BACKGROUND OF THE INVENTION

Because a beam of electrons can be focused to a very small spot, instruments using electron beams can be capable of very high resolution. Electron beams are used in electron microscopes for forming images of microscopic structures and in electron beam processing systems, such as electron beam lithography tools, for creating microscopic structures. For example, electron beam systems are widely used in the manufacturing of integrated circuits to create lithography masks or to create structures directly on a semiconductor wafer.

Electron beam systems typically include an electron gun as a source of electrons and an electron optical column comprised of lenses that focus and direct the electrons emitted from the electron gun. The electron gun typically includes an emitter, extractor, suppressor, and may include one or more electron optical elements. The emitter emits electrons with the help of an electric field supplied by the extractor. The suppressor suppresses emission of electrons from the sides of the emitter tip. Such electrons would not end up forming part of the beam. The one or more gun optical elements assist in focusing the electrons into a beam. Because air would disperse the electrons in the beam, the entire electron path, from the electron gun to the target, must be maintained in a vacuum, which adds to the cost and complexity of electron beam systems.

Although electron beam systems usually have higher resolutions than systems that use light, electron beam systems are typically not capable of rapidly processing a large number of integrated circuits and so have not been suitable for high volume production or inspection. One method of increasing the processing rate, or throughput, of electron beam systems is to include within a single vacuum chamber multiple electron beams that can operate on a target simultaneously. For example, U.S. Pat. No. 4,390,789 to Smith and Harte describes an electron beam lithography system that includes nine electron sources and nine electron optical columns. The system described in U.S. Pat. No. 4,694,178 to Harte includes twelve electron sources and twelve electron columns.

Similarly, U.S. Pat. No. 5,981,962 to Groves et al. describes a multiple beam system that uses a relatively large surface area, low brightness source. Although such sources are easier to handle in an array than are small, high brightness sources, a system using large area sources cannot provide as high a resolution as a system using small, high brightness sources. U.S. Pat. No. 6,023,060 to Chang et al. describes a multiple beam system that uses multiple T-shaped electron beam columns. International Patent Publication WO 99/47978 describes a method of handling a mismatch between the distance between the electron columns and the distance between dies on the target. International Patent Publication WO 98/48443 describes a multiple beam system in which the multiple beams do not have separate optical columns and in which the system electron optics operate on the multiple beams as if they were a single beam.

Multiple beam electron systems have not gained acceptance in industry because they have been unreliable and time consuming to service. In particular, the high brightness electron sources required for high resolution systems are relatively fragile and have a limited lifetime. Failure of a single electron source can cause other electron sources in the system to also fail, and replacing an electron source requires taking the entire system out of service.

One widely used, very bright electron source is a thermal field emitter known as a "Schottky emission cathode" or "Schottky emitter." Schottky emitters typically operate at temperatures of about 1,800 K. The surface of a Schottky emitter from which the electrons are emitted is very sensitive to surface contamination and the emitter will not function properly if foreign molecules are adhered to the working surface. Before a Schottky emitter can be placed in service, it must be conditioned by a lengthy conditioning process, referring to as a "bakeout," which entails baking the emitter and gun to remove adhered molecules from their surfaces.

The useful life of a Schottky emitter is much less than the expected life of the electron beam system, so Schottky emitters need to be replaced periodically. Replacing a single emitter requires opening the vacuum chamber, which exposes the other emitters in a multiple emitter to air. All the emitters then need to be conditioned again before they can be used.

When Schottky emitters are being conditioned or when they are restarted in normal use, they will intermittently eject contamination and cause contamination to be ejected from the extractor and other elements. This phenomenon, known as "outgassing," results when electrons emitted from the emitter strike the extractor and other elements, causing the sudden ejection of gas molecules and other contaminants that were adsorbed onto surfaces during the period when the emitter was not operating. These gas molecules may then collide with other components in the vacuum chamber causing them to emit more gas molecules. This outgassing may increase the gas pressure in the vacuum chamber enough to precipitate emitter arcing (excessively large electron emission), which can damage the emitter tip. This arcing in turn increases the gas pressure in the vacuum chamber and can cause any other emitters present in the vacuum chamber to also arc.

The difficulty with maintaining multiple Schottky emitters in a single system has prevented the widespread use of multiple electron beam systems.

SUMMARY OF THE INVENTION

An object of the invention is to provide a reliable electron beam tool using multiple electron beams to achieve a high processing rate.

The present invention comprises an electron beam system that uses multiple electron guns within a single system. The electron guns are contained in one or more sealable vacuum chambers that can be vacuum isolated from a chamber that contains the work piece that is the target of the beams. The electron guns are preferably relatively isolated from each other during operation, so that failure of one gun is less likely to cause failure of the other guns.

In some embodiments, multiple electron guns are positioned in a single gun chamber that can be vacuum isolated from the vacuum chamber or chambers containing the target and other electron optical elements. In some embodiments, each electron gun is in an individual sealable gun chamber so that the system can be opened and any electron gun can be replaced without exposing the remaining guns to air. Gun chambers can be removed and replaced individually, or individual gun chambers can be grouped into sealable intermediate chambers that can be removed and replaced.

When an electron gun fails, the gun chamber containing the faulty gun is removed from the system and replaced with another sealed gun chamber, preferably containing one or more electron guns that have already been conditioned. Thus, the electron beam system can be put immediately back into production, without the delay of conditioning the new electron gun in the system.

Positioning electron guns in individual gun chambers reduces the conduction of gases from one gun chamber to the other, so arcing of one gun is less likely to cause the failure of other guns in the system. Even in an embodiment in which multiple guns are in a single chamber, a preferred column design serves to reduce the conduction between guns.

In a preferred embodiment, each gun chamber has its own ultra high vacuum pump. The multiple electron beams preferably are capable of operating simultaneously on different parts of a single target, such as different die of a semiconductor wafer.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed can be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
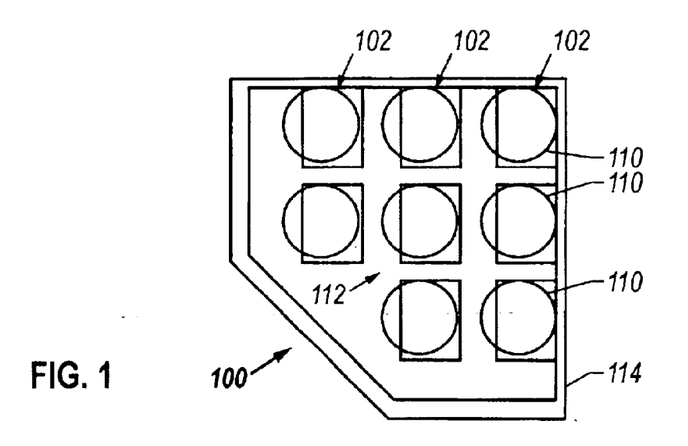
FIG. 1 is a top, cross-sectional view showing schematically one fourth of a multi-column electron beam system embodying the present invention.
Figure 2:
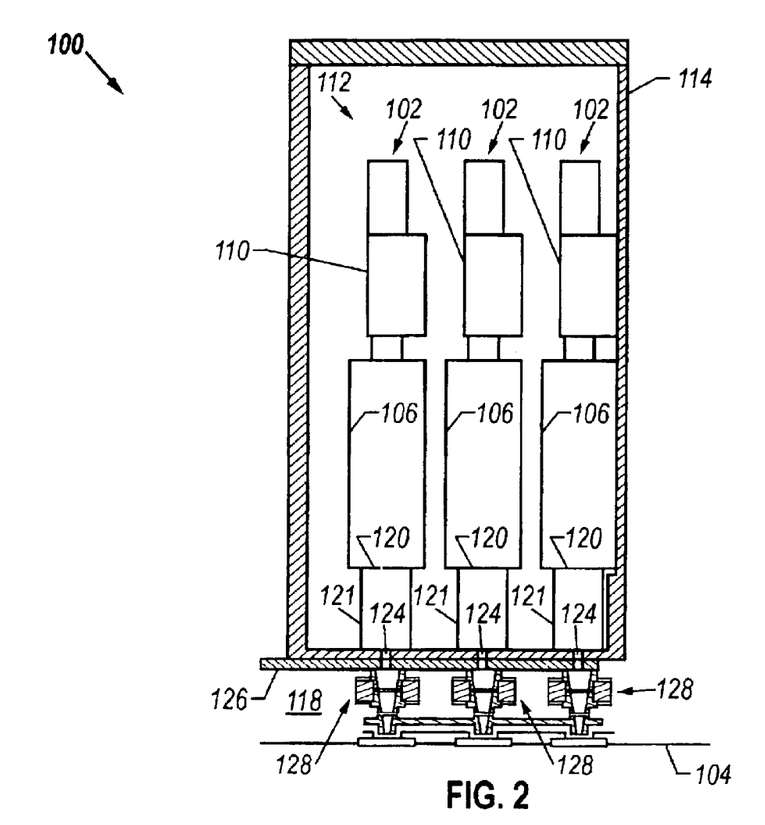
FIG. 2 is a cross-sectional side elevation view of the system of FIG. 1.

FIG. 1 is a schematic top cross-sectional view and FIG. 2 is a schematic side elevation sectional view of a representative portion of a preferred electron beam system 100 of the present invention. Preferred electron beam system 100 includes thirty-two electron beam columns 102 (eight shown), which are arrayed above a target 104, typically a three hundred millimeter semiconductor wafer. The system portion shown in FIGS. 1 and 2 represents one fourth of system 100 and would cover a 90 degree quadrant of the target wafer. The thirty-two electron beam columns 102 include thirty-two electron guns (not shown), each within a sealable gun chamber 106 that has its own small ultra high vacuum (UHV) pump 110. The thirty-two gun chambers 106 are divided into four groups 112 (one shown), each group 112 including eight gun chambers and positioned within a separate sealable intermediate chamber 114. The beams from the eight electron guns within each sealable intermediate chamber 114 cover a ninety degrees segment of the target, which is positioned in a main vacuum chamber 118.

Within intermediate chamber 114, columns 102 are placed in an incomplete square array with a spacing of approximately fifty millimeters between the column centers. One vacuum pump 110 is fastened to the top of each gun 106. Vacuum pump 110 is preferably an ion pump, which provides the ultra high vacuum pumping to the gun and also provides a measurement of vacuum pressure. Other ultra high vacuum pumps, such as a getter pump, could also be used but getter pumps do not provide an indication of the pressure within the chamber.

Below each gun chamber 106, at the base of the intermediate vacuum chamber, is an isolation valve 120, which selectively seals that gun chamber 106 from intermediate vacuum chamber 114. Ceramic housing 121, positioned below the gun chamber 106 within vacuum chamber 114, contains additional electron column elements. At the base of intermediate chamber 114 and below gun chambers 106 are placed "ganged" isolation valves 124. These ganged isolation 124 valves can be simultaneously closed by lever 126 to seal the beam path openings between intermediate chamber 114 and main chamber 118. An O-ring seals the top of intermediate chamber 114 to main chamber 118. Below these valves 124 are placed the electron optical elements 128, including final lenses and through-the-lens detectors, which are described in more detail below.

FIGS. 1 and 2 show that the individual Schottky emission gun chambers 106 each have a vacuum pump 110 and vacuum isolation valve 120. Eight gun chambers 106 are then placed in a common high vacuum, intermediate chamber 114, which is turbo pumped and provides the differential pumping to the main vacuum chamber 118, which contained the work piece. Individual gun chambers 106 can be installed without breaking vacuum in the other gun chambers 106 and exposing the emitters in those gun chambers therein to air. To replace a gun, the intermediate vacuum chamber ganged valves 124 are closed, and the individual gun isolation valves 120 are closed. The intermediate vacuum chamber 114 is then brought up to atmospheric pressure, and the failed column 102 is replaced without disturbing other columns 102 in intermediate chamber 114.

Intermediate chamber 114 is then pumped to its operating vacuum level, and the emitters are re-started. Since the replacement gun is in its own sealable vacuum chamber, the replacement gun chamber can be preconditioned and vacuum-sealed before being place into intermediate chamber 114. The emitter would then not need to be conditioned within system 100 before being brought into service, thereby reducing the time that system 100 is out of service.

In operation, even when all the isolation valves 120 and 124 between gun chambers and intermediate chambers 114 are open, each gun is relatively isolated from the other guns and the conductance of gases between chambers 106 is small. If one gun arcs, the resultant pressure increase is softened by the small gas conductance to other guns, reducing the likelihood that arcing in one gun will cause emitter failure in another.

A preferred electron beam system 100 includes four of the intermediate chambers 114 shown in FIGS. 1 and 2, each containing eight columns 102. System 100 thus provides a total of thirty-two columns 102 over a 300 mm wafer. A column 102 can be replaced by swapping an entire eight-column intermediate chamber 114 or by replacing the individual failed column 102 while intermediate chamber 114 remains on the system. Although all 32 separately sealable guns could be within a single chamber, keeping the number of columns per intermediate chamber 114 to only eight columns reduces the risk of having massive, multiple emitter damage resulting from an arc. Furthermore, failure of other components within the intermediate chamber is less risky to correct.

Figure 3:
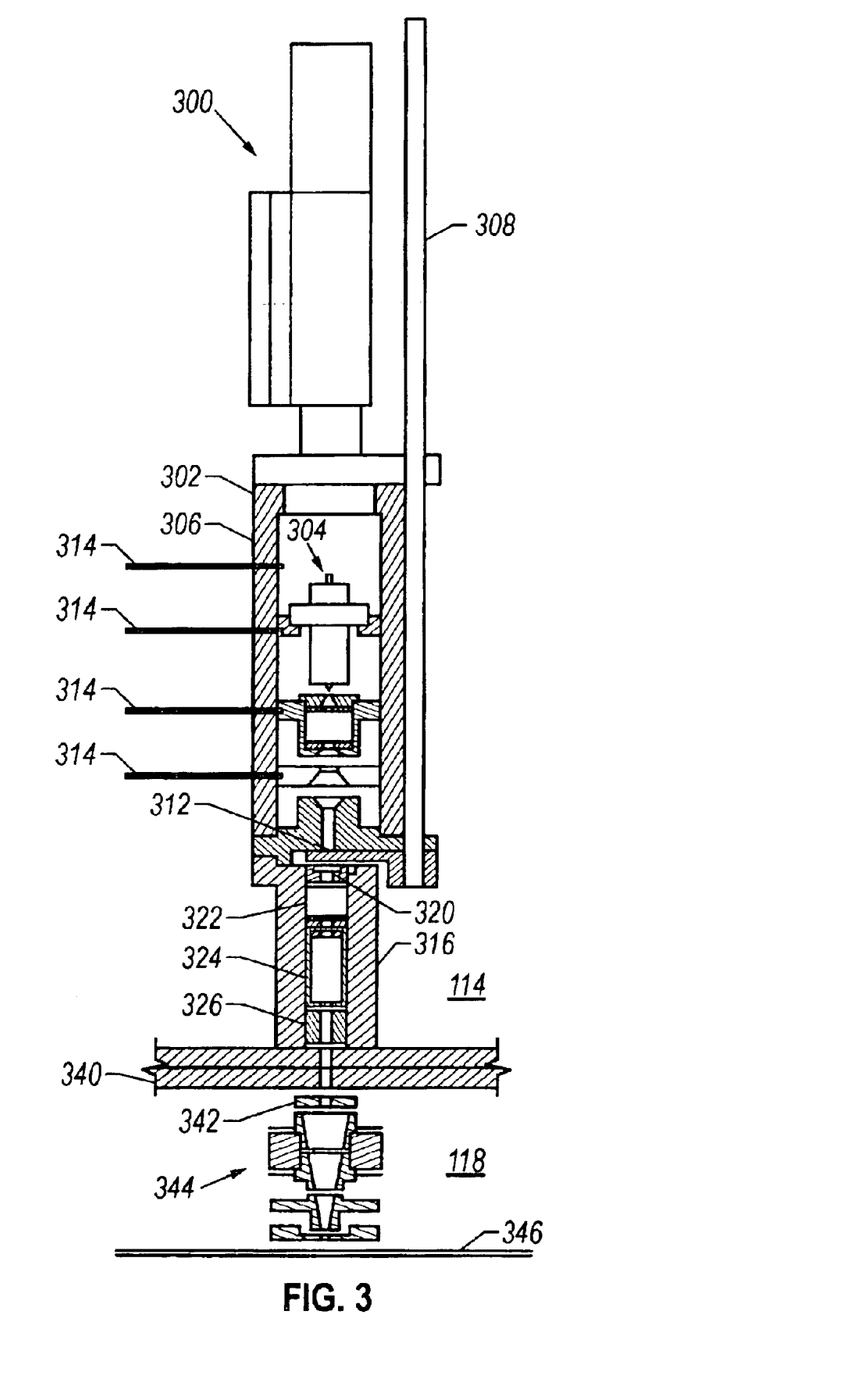
FIG. 3 shows a side view in greater detail of one column of the system in FIG. 1 and FIG. 2.

FIG. 3 is a cross-sectional view of a column 300 for use in system 100 shown in FIGS. 1 and 2. System 100 is not limited to any particular column design, and other column designs could also be used. As shown in FIG. 3, a gun chamber 302 includes an electron gun 304 within a gun body 306. A rod 308 or other mechanism opens and closes a vacuum isolation valve 312 at the base of the gun body 306. Gun body 306 is preferably ceramic with lens elements glued inside. Multiple high voltage pins 314, shown as short black lines, go through the side of the gun body 306 and may be brazed in place for vacuum sealing at high temperatures. Below the gun 304 is a ceramic housing 316 that contains a fixed position aperture 320, beam blanker plates 322, a Faraday cup 324, and beam steering octupole 326. The construction and operation of such components are known in the art. Ceramic housing 316 can remain in intermediate chamber 114 when the gun chamber 302 is removed. Gun chamber 302 is aligned onto ceramic housing 316 using known methods, such using close fitting, mating steps on the two housings. Ceramic housing 316 is aligned with optical elements below chamber 114, so when gun chamber 302 is aligned onto ceramic housing 316, gun chamber 302 is FIG. 3 also shows a ganged isolation valve 340 that operates to seal column 300 shown as well as other columns in the same intermediate chamber. Below ganged isolation valve 340 are additional electron optical elements including a detector 342 and a final lens 344 above a work piece 346, such as a semiconductor wafer. The target and the final lens are both typically biased to about negative nine thousand volts in relation to the electron source.

Figure 4:
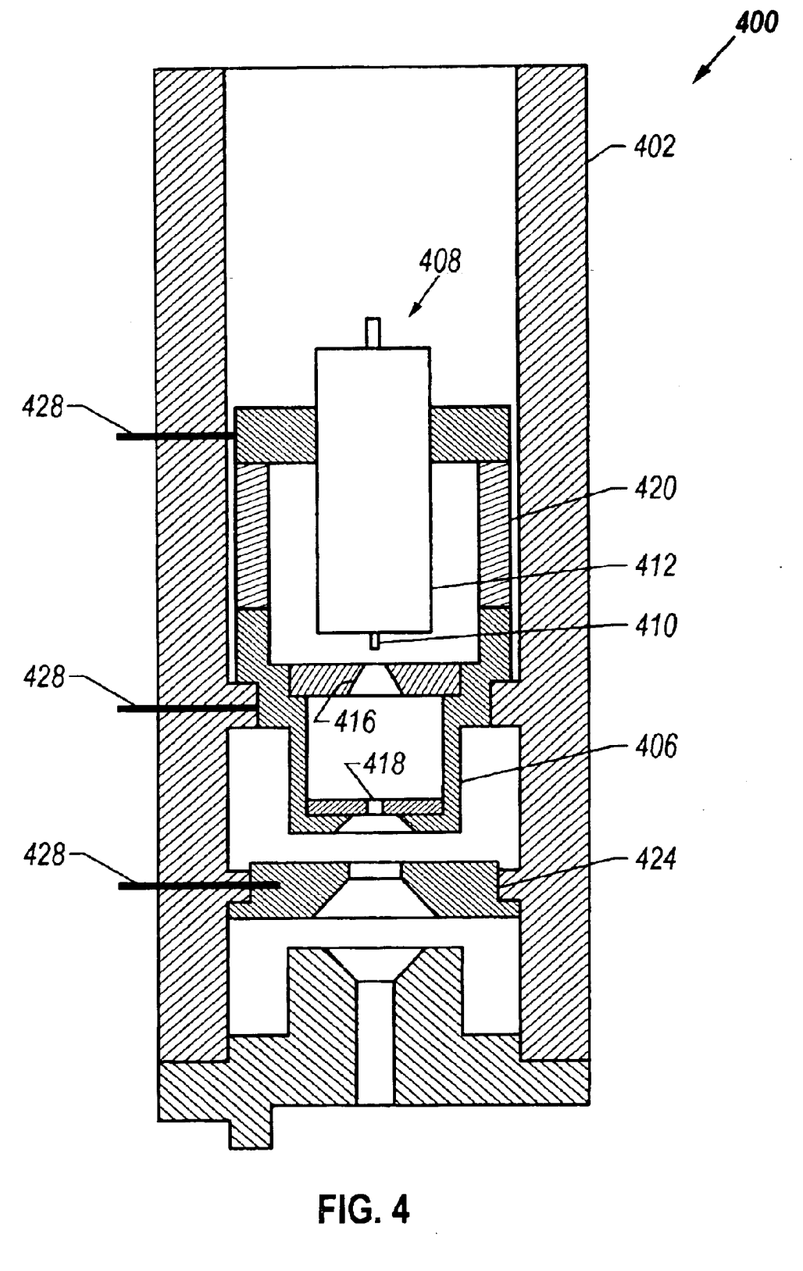
FIG. 4 shows an electron gun assembly that can be used in the electron beam column of FIG. 3.

FIG. 4 shows a preferred electron gun assembly 400 that can be used in the electron beam system of FIG. 1. The electron gun assembly of FIG. 4 is of a somewhat different design than the electron gun assembly shown in the electron beam column of FIG. 3. Electron gun assembly 400 includes a gun dielectric or insulator bushing 402 that supports gun lens elements and a "U"-shaped member or gun lens first element 406. A removable emitter assembly 408 includes an emitter 410, a suppressor 412, and extractor 416, and an extractor aperture 418. Emitter assembly 408 fits with close tolerance into the gun insulator bushing 402, which has been aligned with other elements of the electron optical column. The emitter assembly 408 is therefore properly aligned upon installation. Emitter assembly 408 is supported on an insulator 420. Having a gun lens first element that is separate from the emitter assembly reduces handling of the lens first element, thereby preventing damage to its lower surface, which must support a large electric field stress during operation. Gun lens first element 406 and a focusing element 424 are preferably glued into the gun bushing 402 using a precision alignment fixture. High voltage feedthroughs 428, shown as black lines, provide voltage to the gun elements. Means to connect the various gun electron optical elements to their electrical leads and to fasten this emitter assembly to the gun insulator bushing are known and are not shown in FIG. 4.

As is known in the art, the elements in the gun assembly must be carefully aligned so that the optical axes of their elements coincide. Moreover, in a multiple column system, the distance between the ion source and the extractor within each column is preferably the same to within approximately ten microns, so that the performance of the columns within the system do not vary to an unacceptable extent.

The distance from the electron source to the extractor is the typically the sum of several intermediate dimensions. One such dimension, the distance from the emitter tip to emitter base is fixed during the emitter fabrication process. The remaining intermediate dimensions should be tightly controlled during the gun assembly process to maintain the overall source-to-extractor dimension. The emitter assembly height and parallelism must also be controlled during electron gun assembly. Particularly the parallelism from the ceramic tower flange to the base flange, which holds the emitter assembly, must be controlled.

Figure 5:
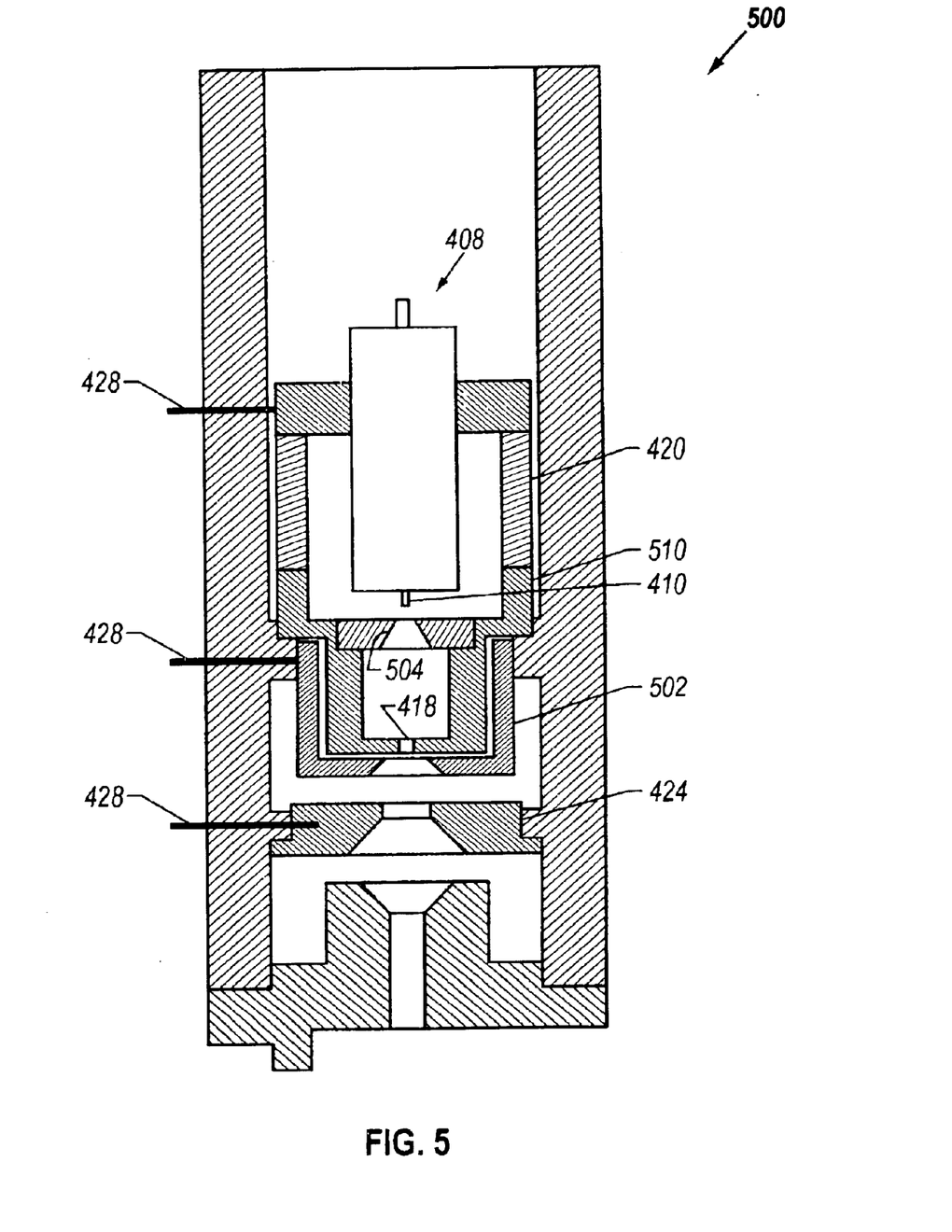
FIG. 5 shows an alternative electron gun assembly that can be used in the electron beam column of FIG. 3.

FIG. 5 shows an electron gun 500 having an alternate design. Elements of gun 500 that are the same as corresponding ones on gun 400 of FIG. 4 are identified by the same reference numbers. In electron gun 500, a lower element 502 of an extractor 504 also functions as the gun lens first element. Because it is functioning as a gun lens element, the lower element 502 preferably has low parallelism error and radial runout with respect to the extractor flange 510.

Figure 6:
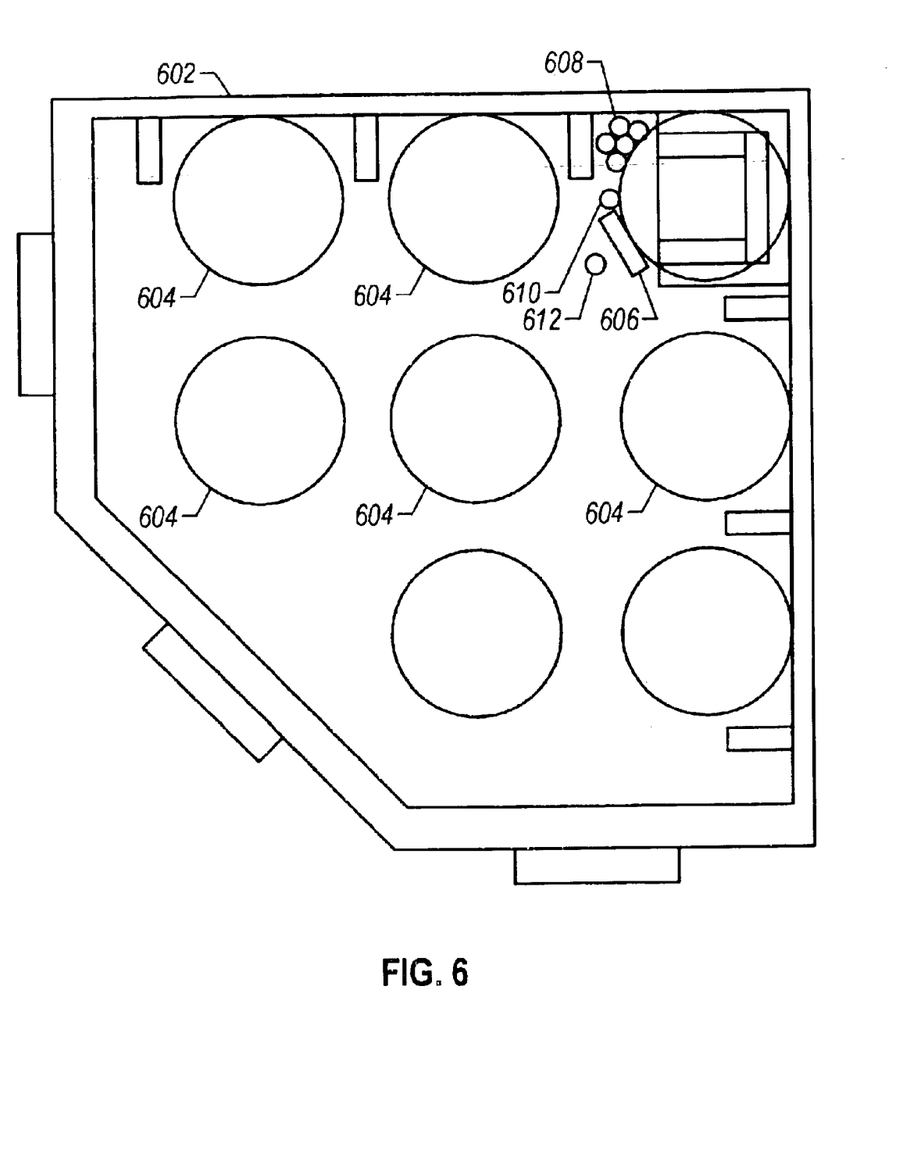
FIG. 6 is an enlarged top view similar to FIG. 1 and showing the routing of control mechanisms.

FIG. 6 is a top, sectional view of an intermediate chamber 602 similar to that shown in FIG. 1. Intermediate chamber 602 includes eight columns 604. Each electron optical column requires multiple cables and control rods to operate. FIG. 6 shows on one single column the cables and control rods used to operate that column. The cables and control rods on the other columns are not shown. The cables and control rods include a beam blanker and beam steering cable 606, gun high voltage cables 608, gun isolation valve rod 610, and a faraday cup cable 612. The valve control rods and various cables come up the sides of the column for connection above.

The final lens assembly and detector, positioned in the primary vacuum chamber is preferably of the type described in U.S. Pat. No. 6,218,664 to Krans et al. for an "SEM Provided with an Electrostatic Objective and Electrical Scanning Device," which is hereby incorporated by reference and which is described below with respect to FIG. 7.

Figure 7:
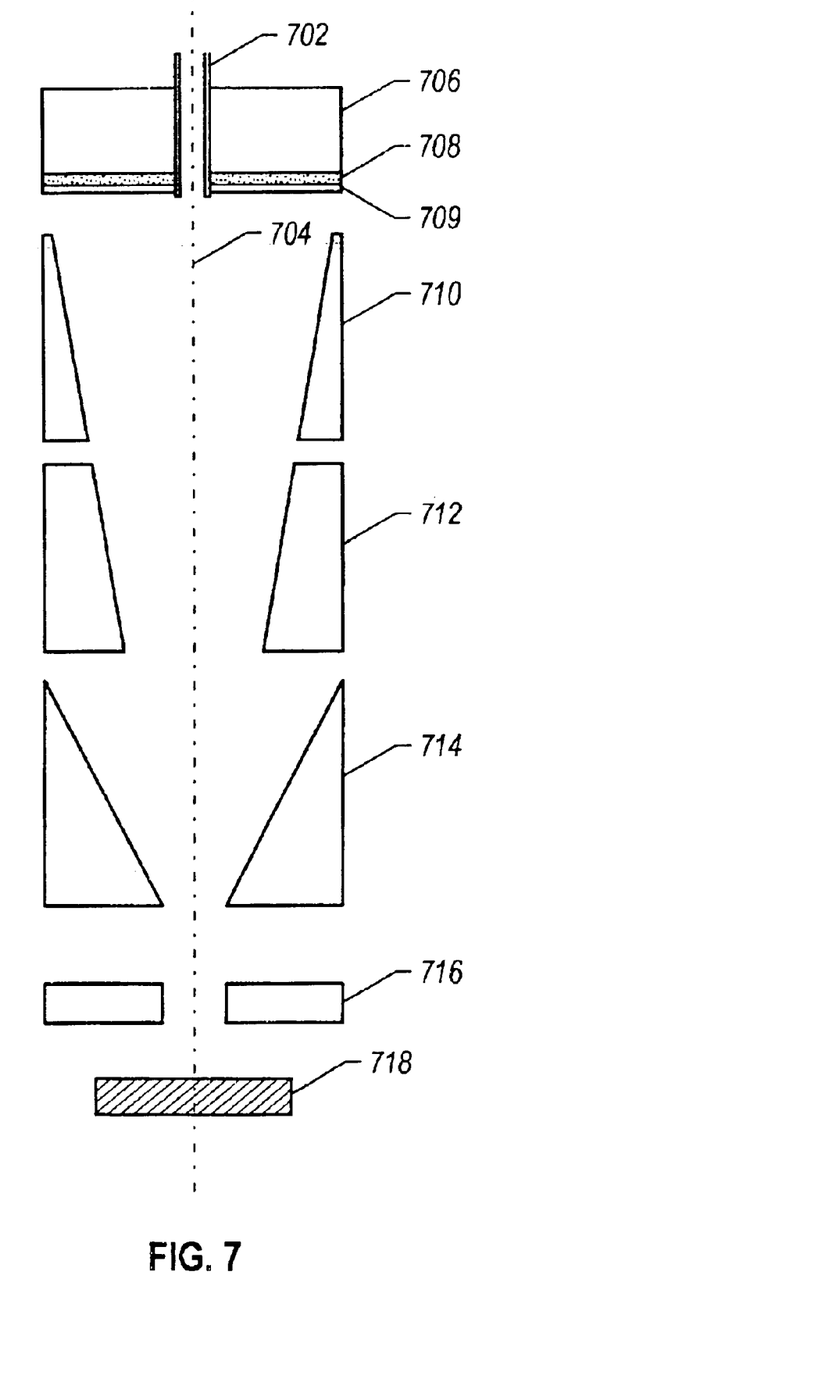
FIG. 7 is an enlarged schematic view of the lower lens assembly of the system of FIG. 3.

In FIG. 7, the primary electron beam (not shown) travels along the optical axis 704 of the lens. The primary beam then successively traverses through a detector light transmitting medium 706, a scintillator detector crystal 708, a detector electrode 709, a first electrical deflection electrode 710, a second, or lower, electrical deflection element or electrode 712, a first electrostatic electrode 714, which forms part of the objective lens, and a second electrostatic electrode 716, which also forms part of the objective lens. Finally, the electrons of the primary beam reach a work piece 718 to be examined or worked.

The detector crystal 708 forms part of a detection means for the detection of electrons emanating from the work piece in response to the incidence of the primary beam. This detector crystal consists of a substance, such as cerium-doped yttrium aluminum garnet or YAG, which produces a light pulse in response to the capture of an electron of adequate energy. The light pulse is conducted further by means of an optical guide means (not shown) and is converted, in an opto-electric transducer, into an electrical signal from which an image of the specimen can be derived, if desired. The light transmitting medium 706, a scintillator detector crystal 708, and a detector electrode 709 are penetrated by a conductive tube 702 to provide for the passage of the primary beam.

The conductive tube 702, the detector electrode 709, as well as deflectors 710 and 712, and objective lens electrodes 714 and 716 all serve to focus the primary beam. The detector electrode 709 is shaped as a flat plate that is provided with a bore for the primary beam and is deposited on the surface of detection crystal 708 in the form of a conductive oxide, for example indium and/or tin oxide. The detector electrode 709 can be adjusted to a desired voltage, for example 9 kV, by means of a power supply unit (not shown).

The first electrical deflection electrode 710 and the second electrical deflection electrode 712 form part of a beam deflection system for deflecting the primary beam. Each of these two electrodes has an external shape in the form of a straight circular cylinder and an internal shape in the form of a cone that tapers in the direction of the beam. Each of the electrodes 710 and 712 is then subdivided, by way of two saw cuts in mutually perpendicular planes through the optical axis, into four equal parts so that each of the electrodes 710 and 712 is capable of producing electrical dipole fields in the x direction as well as the y direction by application of suitable voltage differences between the portions, so that the primary beam can be deflected across the work piece 718 and the path of the secondary electrons moving in the direction of the detector crystal can be influenced.

Instead of subdividing the electrodes 710 and 712 into four parts using two saw cuts, the electrodes can be subdivided into a larger number of parts, for example, eight parts by means of four saw cuts in a plane through the optical axis. A larger number of equal parts is preferred, because by application of the appropriate voltages to the various parts of each of the electrodes, the system thus formed can be used not only for deflecting the beam but also as a stigmator.

The eight parts of electrodes 710 and 712 form two octupoles. Cutting is preferable performed by electro-discharge machining (EDM). It can be difficult to make the required sixteen electrical connections to the two octupole lenses. Although conventional electrical connections can be used, a preferred connection method entails using a flexible printed circuit board (not shown) having holes and surface electrical contacts corresponding to the octupole pin positions. Flexible printed circuit board is wrapped around the cylindrical octupole ceramic. The octupole pins are electrically connected with the PC board contacts points, for example, using conductive epoxy. The flexible PC board thus forms a cable for the octupole deflector leads. The other end of the PC board includes a connector or contacts for insertion into a connector.

Applicants have discovered that the deflector elements can also be used to finely focus the electron beam. It has been generally considered undesirable to have a focusing element as early in the optical path as are deflectors 710 and 712. Applicants have found, however, that deflectors can be used to finely focus the electron beam, if the applied voltage is not too great.

To use the deflectors for fine focusing, they are floated a few volts above or below their normal potential, and therefore function as a lens to change the focus length of the electron column. If deflection elements 710 and 712 are controlled separately, the focusing voltage is preferably applied only to the deflection element 712. If elements 710 and 712 are electrically connected, the fine focusing voltage can be applied to both elements.

The first electrode 714 and the second electrode 716 constitute the electrode system that forms the objective lens of the SEM. Internally, the electrode 714 is shaped as a cone that is tapered in the direction of work piece 718. The objective lens electrodes 714 and 716 focus the primary beam in such a manner that the electron source is imaged, typically with a very large reduction, on the work piece, which is at ground potential.

In a typical application, the voltage whereby the primary beam is initially accelerated from the emitter through the first lens amounts to about 9 kV and the final landing energy on the specimen is about 1 kV. The work piece, beam blanking elements, Faraday cup, beam steering elements, ganged isolation valves, detector and deflection systems are preferably near ground potential. The emitter is at about −1 kV, and the voltage at the detector is approximately 9 kV. The voltage on electrode 710 and 712 includes a focusing, or direct, voltage component and a scan voltage component. The focus component of the voltage at electrodes 710 and 712 is 9 kV. The scan component of the voltages on plates 710 and 712 is typically up to about 2 kV and 1.8 kV, respectively, which voltages are added to the 9 kV focusing voltage. An alternate method to operate elements 710 and 712 is to use a common voltage for both. The same scan voltages can be supplied to opposing octupole plates relative to the primary beam optical axis, provided that the relative geometry of these elements crosses the beam over the optical axis at the principle plane of the final lens, as is know in the art.

The desired course of the electron paths of the primary beam electrons and the secondary electrons can also be realized while using voltage values other than those described above for the direct voltage and the scan voltage, which generally varies as a function of time like a saw tooth across the electrodes 710 and 712. The choice of said other voltage values is based on the following insight. Adjustment of the system for a high magnification necessitates a high resolution, but the area to be imaged is relatively small because of the high magnification. A high resolution requires a comparatively high acceleration voltage at the parts of the column at the level of the decelerating objective lenses 714 and 716 because of the interaction of the electrons during their travel through the electron optical column and also because the influencing of the electron beam by external disturbing fields should be minimized. This high acceleration voltage can be achieved by supplying the assembly formed by the electrodes 702, 709, 710, and 712 with a comparatively high direct voltage, for example with said value of 9 kV, with the work piece grounded. When a large field of view is required, the high value of the direct voltage makes it necessary to use a high scan voltage on the electrodes 710 and 712. For example, for a field of view of 2 mm, a 2 kV scan voltage is used, producing a landing energy of the electron beam on the specimen of about 1 keV with a working distance of 3 mm. However, because only a small field of view need be scanned in the case of a high-resolution exposure, a scan voltage that is relatively low amplitude compared to that of the direct voltage can be used. A further calculation reveals that in such a case it suffices to use an amplitude amounting to some tens of volts, for example 50 V, for a field of view of 50 μm×50 μm for a direct voltage of 9 kV on the electrodes 710 and 712, a landing energy amounting to 1 keV and a working distance amounting to 3 mm.

When the system is adjusted to provide a low magnification, however, a lower resolution suffices; however, because of the low magnification, the area to be imaged is then greater than in the case of a high resolution. Because of the lower permissible resolution, the acceleration voltage of the electron beam at the level of the scan electrodes 710 and 712 can be lower, for example 1.5 kV. Because of this low value of the direct voltage, a low value of the scan voltage at the electrodes 710 and 712 also suffices. In this case, a large field of view must be scanned, so a relatively high amplitude of the scan voltage is required. A further calculation reveals that in such a case, an amplitude of some hundreds of volts, for example 500 V, is required for a field of view of 2 mm and a landing energy of 1 keV.

It appears in both the high resolution case and the low resolution case that the scan amplitude required is substantially lower than said first value of 2 kV, which was based on a worst case situation (i.e. high direct voltage and large field of view). This lower amplitude for the scan voltage offers significant advantages in respect of the construction of the SEM and the associated power supply equipment. For example, the power supply equipment can be constructed so as to be significantly smaller and, because of the lower amplitude, its stability (being a fraction of the maximum amplitude to be delivered by this equipment) can be improved proportionally. Furthermore, the supply wires to the various parts of the electrodes 710 and 712 can then be more readily assembled in one cable. Because of the risk of electrical breakdowns, such assembly in not preferred when using the higher voltage of about 2 kV. In a preferred embodiment, one or more printed circuit boards within the vacuum chamber are used to route the voltages between elements in the different columns and elements within the same column.

The focus elements and the second lens assembly ground potential elements are preferably each fabricated from metal plates as single units.

The primary beam entering the assembly formed by the detector, the deflection electrodes and the objective lens initially travels along the optical axis 704. Under the influence of the electrical deflection field generated by the electrode 710, the beam is deflected away from the axis and then it is deflected back towards the axis under the influence of the opposed deflection field generated by the electrode 712. As a result, the primary beam intersects the optical axis far below the deflection electrodes 710 and 712. As a result of the arrangement of electrode and of the beam deflection system operating with two opposite fields, the tilting point is situated in the central plane of the objective, providing a large field of view and a minimum imaging error, regardless of the magnitude of the scanning motion of the primary beam.

The incidence of the primary beam on the work piece 718 releases secondary electrons from the specimen that travel upwards under the influence of the electrical field of the objective lens elements, of the deflection system and of the detector voltage. The secondary electrons are pulled into the bore of the objective, after which they become subject to the deflector fields. Even secondary electrons that emanate from the specimen at unfavorable angles are still drawn up through the objective lens in such a manner that they are still captured by the detector crystal.

Figure 8:
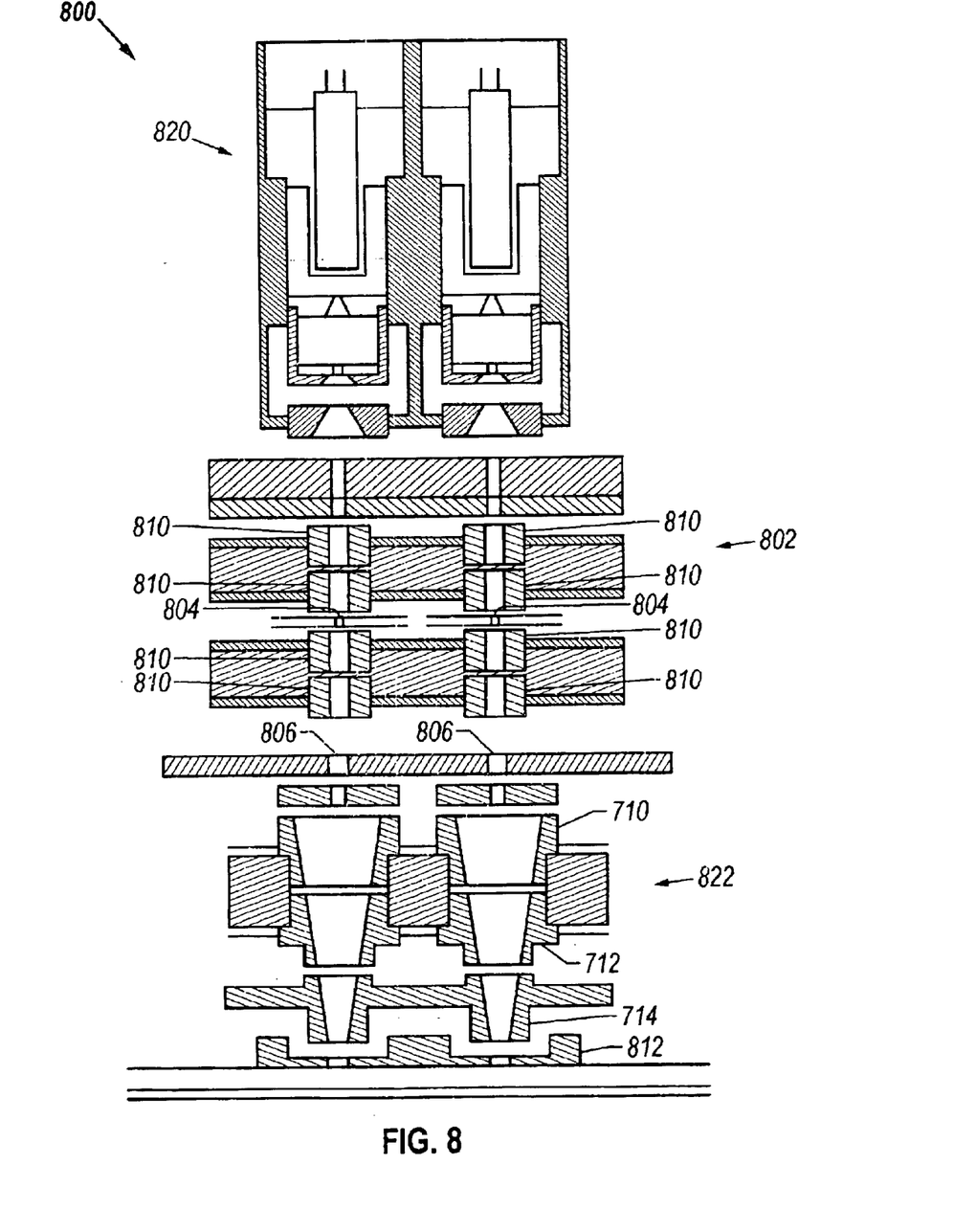
FIG. 8 is a cross-sectional view of another preferred embodiment of electron columns for use in a multi-column electron beam system of the present invention.

FIG. 8 shows an alternate design for an electron optical column 800 that can be used in the system of FIG. 1. The embodiment of FIG. 8 uses a chicane beam blanker 802, which allows more accurate placement of the beam in apertures, and provides multiple apertures 804 and 806. By "chicane" is a series of magnetic or electrostatic deflectors 810 that produce fields that deflect the electron beam. These deflectors can be formed using a parallel plate construction array for simplicity and improved column-to-column alignment. The final lens 812 is also shown constructed in a plate array.

In this embodiment, the gun assembly 820 and the lower lens assembly 822 can be similar to those described above with respect to the previously described embodiments. Elements that are the same as in previous figures are identified using the same reference numbers.

In the electron columns described above, the beam blanking elements, Faraday cup, beam steering elements, ganged isolation valves, detector and deflection systems are preferably near ground potential. The associated electronics and column designs are therefore greatly simplified. This design then requires the emitter, suppressor, extractor, wafer and final lens element to be at moderate negative potential, but that is relatively simple to implement. For example, the emitter 408 (FIG. 4) could be at −10 kV, the suppressor 412 at −10.5 kV, the extractor 416 at −5 kV, the gun lens 406 at −8 kV, the focus lens 714 at +2 kV, and the final lens element 716 and sample 718 at −9 kV.

Figure 9:
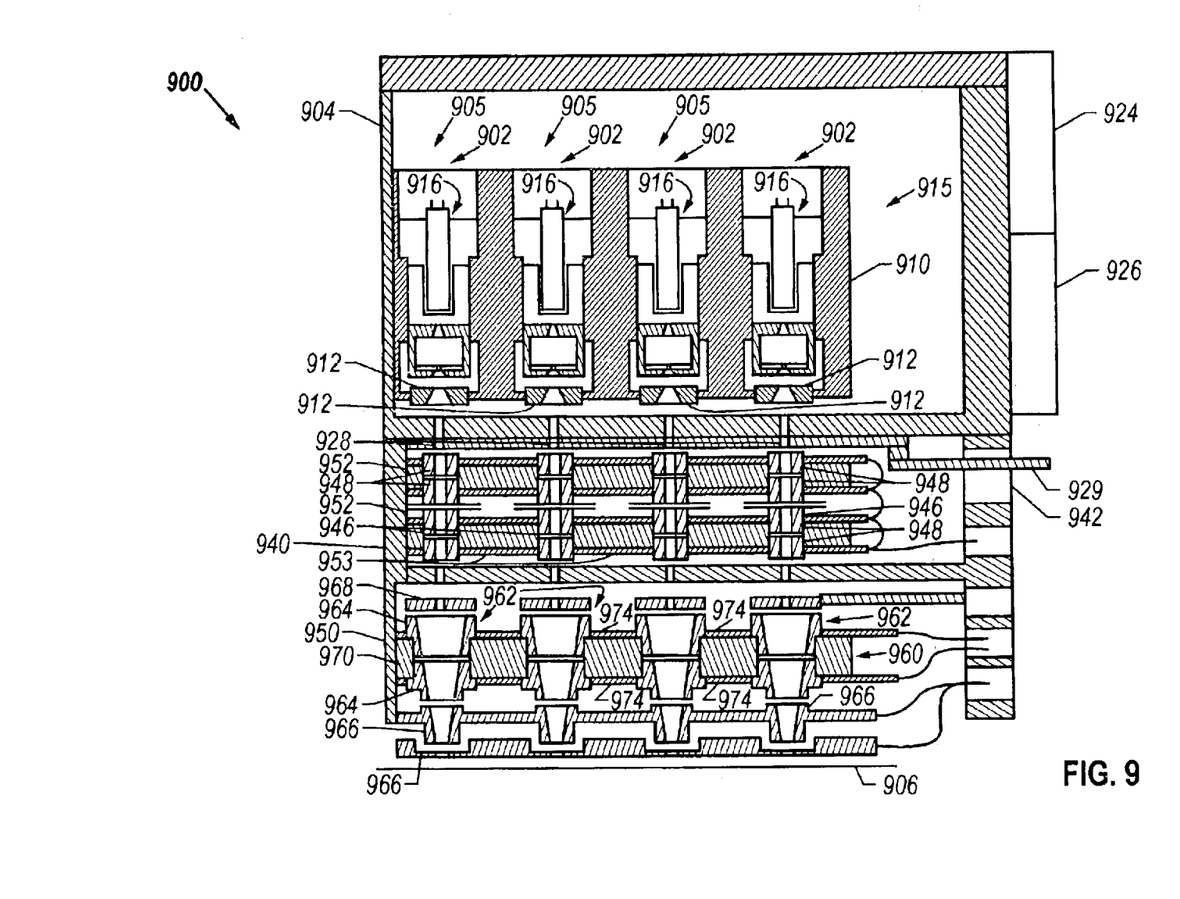
FIG. 9 shows a cross sectional view of another embodiment of a four column electron beam system of the present invention.
Figure 10:
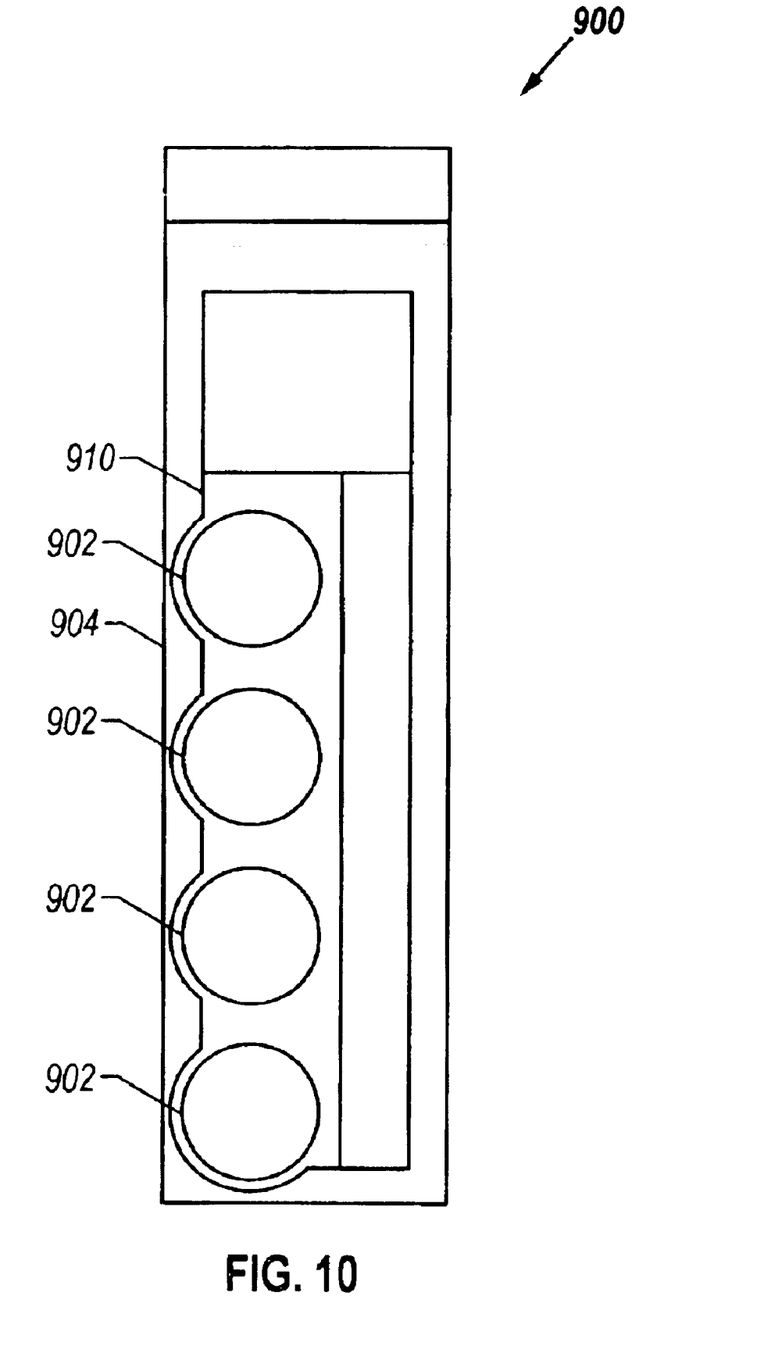
FIG. 10 is a top view of the embodiment of FIG. 9.

FIGS. 9 and 10 show an alternative embodiment comprising an electron beam system 900 including multiple electron guns 902 in a single, ultra high vacuum gun vacuum chamber 904 and multiple electron optical columns 905. Gun chamber 904 can be vacuum isolated from the next vacuum chamber in the beam path, which can be an intermediate chamber or the chamber containing a work piece 906.

Electron guns 902 preferably comprise an array of four Schottky guns contained in a single piece, ceramic bushing 910, preferably comprising alumina. Each electron gun 902 comprises a lens elements 912, which are preferably glued into ceramic bushing 910 to form a gun bushing assembly 915. Each electron gun 902 also includes an emitter assembly 916, which is preferably removable and self-aligned to the gun bushing 910. Gun chamber 904 is vacuum-sealed using, for example, Helicoflex seals (not shown).

Gun vacuum chamber 904 is evacuated to an ultra high vacuum by using an ion pump (not shown) attached to an ion pump flange 924 on the right side of chamber near gun high voltage feedthroughs 926. Ganged vacuum isolation valves 928 are located at the base of gun chamber 904 and operated by a rod 929. Isolation valves 928 can be closed to preserve the vacuum in gun chamber 904 or opened to allow passage of the four electron beams generated by guns 902 into an intermediate vacuum chamber 940. Lens element 912 is positioned in the gun chamber 904 below each of the emitter assemblies 916. For rapid changing of gun components, gun chamber 904 can be removed and replaced as a unit, or gun chamber 904 can be opened and the gun bushing assembly 915 can be removed and replaced. If the entire chamber 904 is replaced as a unit, it can be replaced with a sealed chamber having electron guns that are conditioned, so that conditioning does not need to be done on the system. If only the gun bushing assembly 915 is removed and replaced, the electron guns would need to be conditioned.

The intermediate chamber 940 is ion pumped through a pump port 942 and optionally has at its base a ganged isolation valve (not shown), separating it from a lower chamber 950 in which the target 906 is placed. Unlike the embodiments described with respect to FIGS. 1 and 2, the gun chamber 904 is positioned adjacent to, not within, the intermediate vacuum chamber 940. Intermediate chamber 940 is vacuum-sealed to the gun chamber 904, for example, by a Viton seal. The electron optical columns 902 may be of the design shown in FIG. 3 or FIG. 8 or of a different design. FIG. 9 shows, for example, a chicane type electronic aperture and beam blanker 946, similar to that shown in FIG. 8. Each of these chicanes 946 is constructed from four electrostatic octupole deflectors 948, which are glued into ceramic plates 952 with holes to fit the deflectors. Wiring to each of the chicanes 946 is facilitated by printed circuit boards 953. Beam steering to the second lens centers can be accomplished by the lower ones of octupoles 948.

The intermediate chamber 940 has a lower section, which contains a lens module 960 including a second lens assembly 962 for each of the electron optical columns 905. The second lens assembly elements, including the beam deflectors 964, focusing elements 966 and the scintillator detectors 968 are housed in this region. The second lens assembly 962 is preferably of the type described above with respect to FIG. 7. The deflectors 964 are glued into a common ceramic plate 970, and electrical connections to the deflectors are made through two printed circuit boards 974. Focus elements 966 and deflection elements 964 are preferably each fabricated from metal plates as single units.

The integrated intermediate chamber having the apertures, beam blanking and steering elements in an upper chamber and the second lens assembly modules in a lower section provides for improved alignment and ease of assembly.

Where not described in detail herein, the designs and construction techniques of lenses, vacuum valves, and other system components are known to skilled persons. Skilled persons would be able to make and operate the system described using the guidance provided by the disclosure above.

The inventive systems described above include several novel aspects, including novel designs for electron beam systems, electron gun chambers, and electron optical columns and techniques finely focusing an electron beam system and for making electrical connections to electron lens components using flexible printed circuit boards. Many of these designs and techniques, while particularly well suited for use in multiple beam systems, are also useful in single beam systems. Many designs and techniques can be adapted to other types of charged particle beam systems, such as ion beam systems.

Embodiments can be customized for particular applications and not every novel aspect is necessarily required to be included in every embodiment, nor is it necessary to achieve every object of the invention in every embodiment.

As described, in some embodiments, the invention provides an electron beam system that uses multiple electron beams that can be focused onto different parts of a single target.

In some embodiments, the invention provides a system in which failure of one electron source is less likely to cause failure of other electron sources in the system.

In some embodiments, the invention provides a system in which one or more electron sources can be replaced without exposing all the electron sources to air.

In some embodiments, the invention provides a system in which the electron beams are in close proximity but electron sources do not cross contaminate each other.

In some embodiments, the invention provides a system having a simple design for the construction of multiple electron beam systems.

In some embodiments, the invention provides a method for fine focusing of electron beam systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An electron beam system for directing multiple electron beams toward a target, comprising:
   a system vacuum chamber containing the target;
   one or more intermediate vacuum chambers, each in selective communication with the system vacuum chamber through a group of vacuum isolation valves;
   multiple electron gun chambers positioned within each of the one or more intermediate vacuum chambers, each electron gun chamber including an electron source and a gun chamber vacuum isolation valve for vacuum isolating the gun chamber so that the intermediate chamber can be opened to replace one of the multiple electron gun chamber without exposing the interior of the remaining electron gun chambers to air and the group of isolation valves allowing the intermediate chamber to be vacuum isolated from the system chamber to allow opening the system chamber without exposing the interior of other intermediate chambers to air.

2. The electron beam system of claim 1 in which the vacuum isolation valves in each of the intermediate vacuum chambers correspond to electron optical columns and are connected together to open and close as a group to alternatively seal the intermediate chamber or allow electron beams to pass to the system vacuum chamber.

3. The electron beam system of claim 1 in which each of the multiple electron gun chambers includes a vacuum pump to evacuate the gun chamber.

4. The electron beam system of claim 1 in which each electron source corresponds to an electron column and in which each electron column includes at least one electron optical element that is within the system vacuum chamber.

5. The electron beam system of claim 1 in which each electron source corresponds to an electron column and in which each electron column includes at least one electron optical elements that is within the intermediate vacuum chamber but outside the corresponding gun chamber.

6. An multiple electron beam system for directing multiple electron beams toward a target, comprising:
a system vacuum chamber containing a the target;
one or more intermediate vacuum chambers, each in selective communication with the system vacuum chamber through one or more vacuum isolation valves; and
one or more electron guns positioned within each of the one or more intermediate vacuum chambers,
the multiple beam system including multiple electron guns.

7. The electron beam system of claim 6 in which each of the one or more electron guns corresponds to an electron optical column and in which each of the electron optical columns includes at least one electron optical element that is within the intermediate vacuum chamber.

8. The electron beam system of claim 7 in which each of the electron optical columns further includes at least one electron optical element that is within the system vacuum chamber and not within any of the intermediate vacuum chambers.

9. The electron beam system of claim 6 in which multiple electron guns are positioned within one or more sealable gun chambers positioned within the intermediate chamber.

10. The electron beam system of claim 9 in which each of the multiple electron guns is contained within a sealable gun chamber that does not contain any other of the multiple electron guns.

11. The electron beam system of claim 9 in which each of the sealable gun chambers includes multiple electron guns.

12. The electron beam system of claim 9 in which each of the multiple electron guns corresponds to an electron column and in which the electron columns each includes at least one electron optical elements that is within the intermediate vacuum chamber but outside the sealable gun chamber.

13. The electron beam system of claim 9 in which each of the one or more sealable gun chambers has an associated vacuum pump for evacuating the chamber and the intermediate chamber has an associated vacuum pump.

14. The electron beam system of claim 6 in which multiple electron guns are positioned directly within the intermediate chamber without being placed in a sealable chamber within the intermediate chamber.

15. The electron beam system of claim 6 in which:
each of the one or more multiple electron guns corresponds to an electron optical column; and
each electron optical column includes at least one additional optical element positioned in the system vacuum chamber.

16. The electron beam system of claim 6 in which:
each of the multiple electron guns corresponds to an electron optical column; and
each electron optical column includes an additional optical elements of a first type, and
further comprising a single sheet of metal supporting and applying the same, non-zero electrical potential to the optical elements of the first type in different ones of the electron optical columns.

17. The electron beam system of claim 16 in which the single sheet of metal supports conductive and insulating inserts that form deflection elements.

18. The electron beam system of claim 6 in which each of the one or more electron guns includes an emitter, a suppressor, an extractor element, and a gun lens first element, the gun lens first element being separate from the emitter, suppressor, and extractor element, and being maintained at approximately the same potential as the extractor element.

19. The electron beam system of claim 6 further comprising:
one or more sealable gun chambers within the intermediate vacuum chamber; and
an electron column associated with each electron gun, each electron column including at least one optical element within the intermediate chamber but outside of the sealable gun chamber and at least one optical element in the system chamber.

20. A sealable electron gun chamber comprising:
an electron gun including:
an emitter for emitting electrons;
a suppressor adjacent to the emitter for suppressing the unwanted emission of electrons; and
an extractor for extracting electrons from the emitter;
a vacuum housing containing the electron gun; and
a vacuum isolation valve in the path of electrons when emitted by electron gun, the vacuum isolation valve sealing the vacuum housing when closed and allowing the emitted electrons to pass out of the vacuum housing when opened, the sealable electron gun chamber allowing the electron gun to be conditioned and sealed before being placed into an electron beam system.

21. The sealable electron gun chamber of 20 further comprising a vacuum pump for evacuating the vacuum housing.

22. The sealable electron gun chamber of 20 in which the electron gun further comprises a gun lens for focusing the electrons emitted by the emitter.

23. The sealable electron gun chamber of 20 further comprising one or more additional electron guns, each additional electron gun including an emitter, a suppressor, and an extractor.

24. The sealable electron gun chamber of 20 in which the emitter is conditioned and the vacuum isolation valve is closed to maintain the emitter in the conditioned state.

25. An electron beam system including multiple electron sources, comprising:
a system vacuum chamber including a target; and
one or more removeable gun vacuum chambers, each gun vacuum chamber including one or more electron guns and capable of being separately sealed, thereby allowing one of the electron chamber guns to be replaced without exposing the other electron guns to air and allowing a gun chamber to be preconditioned, sealed, and inserted into the electron beam system, thereby eliminating the requirement to condition the electron gun within the electron beam system.

26. The electron beam system of claim 25 in which each of the one or more gun vacuum chambers includes a vacuum pump.

27. The electron beam system of claim 25 in which each of the electrons guns is associated with an electron optical column including optical elements to focus and direct the electron beam toward the target, at least one optical element of each electron column positioned in the system vacuum chamber.

28. The electron beam system of claim 27 further comprising an intermediate vacuum chamber selectively opening to one or more of the multiple gun vacuum chambers and to the system vacuum chamber, at least one optical element of each electron column positioned in the intermediate vacuum chamber, the electrons from each electron gun traveling from the gun vacuum chamber through the intermediate vacuum chamber to the target in the system vacuum chamber.

29. A method of replacing one or more electron sources in an electron beam system including a sealable electron gun chamber having a vacuum isolation valve, the method comprising:
evacuating the sealable gun chamber containing one or more electron sources;
conditioning the one or more electron sources;
sealing the sealable gun chamber;
inserting the sealed gun chamber into the electron beam system;
unsealing the sealable gun chamber, thereby providing a path for one or more electron beam from the one or more electron sources to a target.

30. The method of claim 29 in which evacuating the sealable gun chamber includes placing the gun chamber in a vacuum chamber that is then evacuated and in which sealing the gun chamber is performed after conditioning the electron source.

31. The method of claim 29 in which sealing the gun chamber is performed before evacuating the sealable gun chamber.

32. The method of claim 29 in which each of the one or more electron sources includes an emitter and in which conditioning the one or more electron sources includes baking the corresponding emitter.

33. The method of claim 29 in which evacuating the sealable gun chamber containing one or more electron sources includes evacuating a sealable gun chamber containing multiple electron sources.

34. The method of claim 29 in which inserting the sealed gun chamber into the electron beam system includes inserting the sealed gun chamber into an intermediate chamber that is separated by one or more vacuum isolation valves from a system chamber containing the target.

35. The method of claim 29 in which the electron beam system includes deflectors for deflecting an electron beam and an objective lens for focusing the electron beam and further comprising finely focusing the electron beam by applying a relatively small voltage to deflectors that are positioned above the objective lens.

36. A method of replacing an electron source in a multiple electron beam system including multiple intermediate chambers, each containing multiple electron gun chambers, the multiple intermediate chambers including one or more vacuum valves for isolating the intermediate chamber from a system chamber including a target, the multiple electron gun chambers each positioned within one of the intermediate chambers and each having a vacuum isolation valve for sealing the electron gun chamber within the intermediate chamber, the method comprising:
identifying which electron gun chamber contains the electron source to be replaced;
identifying which intermediate chamber contains the electron source to be replaced;
closing the vacuum isolation valves to seal the intermediate chambers that do not contain the electron source to be replaced;
closing the vacuum isolation valves the of electron guns chambers that do not contain the electron source to be replaced but that are within the intermediate chamber containing the electron source to be replaced; and
replacing the electron gun chamber containing the electron source to be replaced with an electron gun chamber containing a conditioned electron source.

37. An electron beam system, comprising:
multiple electron guns; and
multiple electron columns, each column including lower deflection elements, the lower deflection elements for the multiple electron columns being formed from the same sheet of metal with insulator and deflection plate inserts and capable of being biased to provide fine focusing of the electron columns.

38. A method of finely focusing the primary electron beam in a charged particle beam system including an objective lens for focusing the primary electron beam and deflectors that are positioned above the objection lens and that are for deflecting the primary electron beam, the method comprising applying a relatively small voltage to the deflectors that are positioned above the objective lens to adjust the focus of the primary electron beam.

39. An electron gun comprising
an emitter for emitting electrons;
an extractor for applying an extraction voltage to extract electrons from the emitter, the extractor being at an extraction electrical potential in relation to the emitter;
a suppressor for suppressing the emission of undesirable electrons; and
a gun lens first element that is separate from the emitter, suppressor, and extractor element, and is maintained at approximately the same potential as the extractor.

* * * * *